United States Patent
He et al.

(10) Patent No.: US 9,318,437 B1
(45) Date of Patent: Apr. 19, 2016

(54) MOISTURE SCAVENGING LAYER FOR THINNER BARRIER APPLICATION IN BEOL INTEGRATION

(71) Applicant: GLOBALFOUNDRIES Inc., Grand Cayman (KY)

(72) Inventors: Ming He, Menands, NY (US); Kunaljeet Tanwar, Slingerlands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/611,740

(22) Filed: Feb. 2, 2015

(51) Int. Cl.
*H01L 23/48* (2006.01)
*H01L 23/532* (2006.01)
*H01L 23/522* (2006.01)
*H01L 23/528* (2006.01)
*H01L 21/768* (2006.01)
*H01L 21/3205* (2006.01)
*H01L 21/321* (2006.01)
*H01L 23/00* (2006.01)

(52) U.S. Cl.
CPC ...... *H01L 23/53238* (2013.01); *H01L 21/3212* (2013.01); *H01L 21/32051* (2013.01); *H01L 21/7684* (2013.01); *H01L 21/76802* (2013.01); *H01L 21/76843* (2013.01); *H01L 21/76877* (2013.01); *H01L 23/528* (2013.01); *H01L 23/5226* (2013.01); *H01L 23/564* (2013.01)

(58) Field of Classification Search
CPC ............. H01L 23/53238; H01L 23/5226; H01L 23/564; H01L 21/32051; H01L 21/3212; H01L 21/76802; H01L 21/7684; H01L 21/76843; H01L 21/76877
USPC .................................. 257/751, 484
See application file for complete search history.

(56) References Cited

U.S. PATENT DOCUMENTS 7,812,424 B2 * 10/2010 Barth .................. H01L 23/5223
257/532

* cited by examiner

*Primary Examiner* — Tu-Tu Ho
(74) *Attorney, Agent, or Firm* — Ditthavong & Steiner, P.C.

(57) ABSTRACT

A method of forming a thinner barrier/liner stack for vias and metal lines and the resulting device are disclosed. Embodiments include forming a via through an interlayer dielectric (ILD) and capping layer, down to a first metal layer; forming a moisture scavenging layer precursor over the ILD and on side and bottom surfaces of the via; annealing the moisture scavenging layer precursor, forming a moisture scavenging layer; forming a barrier/liner stack over the moisture scavenging layer; and depositing a second metal layer over the barrier/liner stack and filling the via and trench.

20 Claims, 2 Drawing Sheets

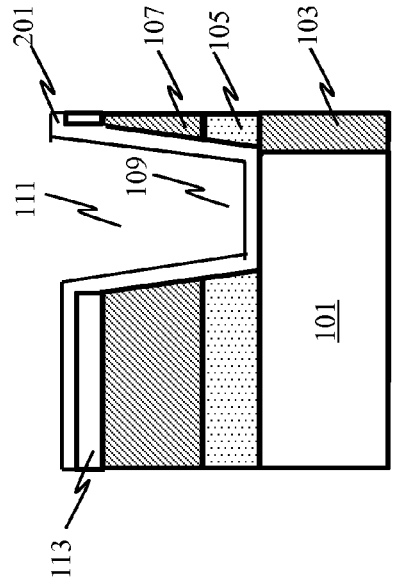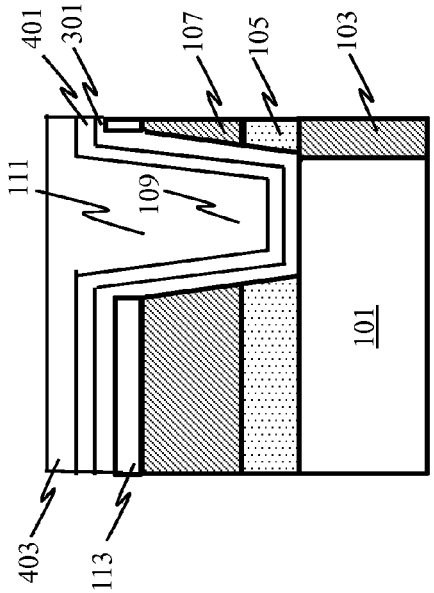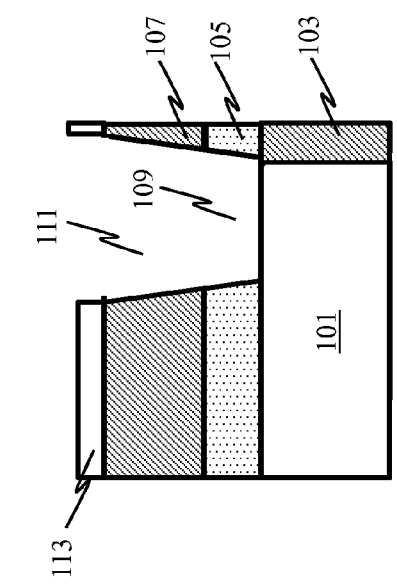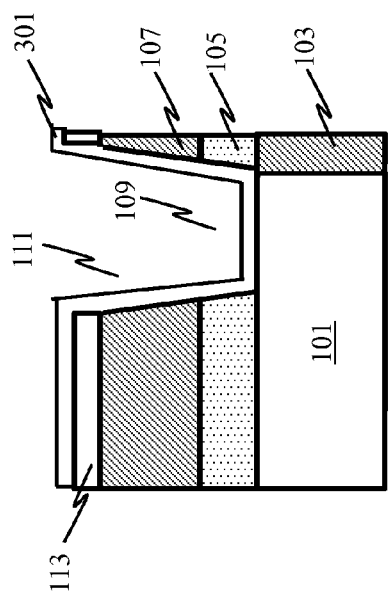

MOISTURE SCAVENGING LAYER FOR THINNER BARRIER APPLICATION IN BEOL INTEGRATION

TECHNICAL FIELD

The present disclosure relates to barrier layers for back-end-of-line (BEOL) metal layers and vias. The present disclosure is particularly applicable to semiconductor devices for the 32 nanometer (nm) technology node and beyond.

BACKGROUND

Semiconductor vias include a barrier/liner to protect the metal from oxygen and moisture. A typical barrier/liner thickness in current semiconductor vias is 35 angstroms (Å) at sidewall surfaces and 70 Å at the bottom surface. To reduce via and line resistance, a thinner barrier/liner stack is needed. However, attempts to reduce the thickness have been unsuccessful as they have reduced the barrier properties of the stack. For example, atomic layer deposition (ALD) of tantalum nitride (TaN) followed by physical vapor deposition (PVD) of tantalum (Ta) improves via and possibly line resistance. However, since ALD TaN has much lower density than PVD TaN (currently employed), its barrier property against moisture penetration into the copper (Cu) line from the ultra-low-k (ULK) material used for the interlayer dielectric (ILD) is poorer, thereby challenging EM reliability.

Similarly, PVD TaN with chemical vapor deposition (CVD) of cobalt (Co) or ruthenium (Ru) can thin down the overall barrier/liner stack. However, CVD Co or Ru is not an oxygen/moisture barrier. Accordingly, the PVD TaN must act as the moisture barrier, thereby requiring a thicker TaN layer, which negates the reduction in thickness and resistance. ALD TaN with CVD Co or Ru can achieve the thinnest and most conformal barrier/liner bilayer stack. However, neither ALD TaN nor CVD Co or Ru is a good moisture barrier. Therefore, EM reliability suffers even more than the other approaches. Single layer manganese nitride (MnN) or manganese (Mn) or Mn doped ALD TaN can be formed to thicknesses below 15 Å, but oxidation stress tests indicate that they are inferior to PVD TaN plus Ta.

A need therefore exists for methodology enabling formation of a thin barrier/liner stack without compromising moisture and oxygen barrier properties and the resulting device.

SUMMARY

An aspect of the present disclosure is a method of forming vias and metal lines including forming a moisture scavenging layer prior to forming a barrier/liner stack between an ILD and the vias and metal lines.

Another aspect of the present disclosure is a device including a moisture scavenging layer between an ILD and vias and metal lines.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a via through an ILD and capping layer, down to a first metal layer; forming a moisture scavenging layer precursor over the ILD and on side and bottom surfaces of the via; annealing the moisture scavenging layer precursor, forming a moisture scavenging layer; forming a barrier/liner stack over the moisture scavenging layer; and depositing a second metal layer over the barrier/liner stack and filling the via and trench.

Aspects of the present disclosure include the ILD including a ULK dielectric layer. Further aspects include forming the moisture scavenging layer precursor of manganese or titanium. Another aspect includes forming the moisture scavenging layer to a thickness of 5 to 20 Å. Other aspects include forming the barrier/liner stack to a thickness of 10 Å to 80 Å on the side and bottom surfaces of the via. Additional aspects include forming the barrier/liner stack of TaN and Ta. A further aspect includes forming the barrier/liner stack of TaN and Co or Ru. Another aspect includes depositing the second metal layer of Cu. An additional aspect includes performing chemical mechanical polishing (CMP) subsequent to depositing the second metal layer. Other aspects include forming a second capping layer over the second metal layer subsequent to performing CMP.

Another aspect of the present disclosure is a device including: a first metal layer; a capping layer over the first metal layer; an ILD over the capping layer; a trench formed inside the ILD, a via formed through the ILD and the capping layer, down to the first metal layer; a moisture scavenging layer over the ILD and on side and bottom surfaces of the via and trench; a barrier/liner stack over the moisture scavenging layer; and a second metal layer over the barrier/liner stack and filling the via and trench.

Aspects include the ILD including a ULK dielectric layer. Further aspects include the moisture scavenging layer including manganese oxide ($MnO_x$) or titanium oxide ($TiO_x$). Another aspect includes the moisture scavenging layer having a thickness of 5 to 20 Å. Other aspects include the barrier/liner stack having a thickness of 10 Å to 80 Å on the side and bottom surfaces of the via. Additional aspects include the barrier/liner stack including TaN and Ta. A further aspect includes the barrier/liner stack including TaN and Co or Ru. An additional aspect includes the second metal layer including copper. Other aspects include a second capping layer over the second metal layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 5 schematically illustrate sequential steps of a process flow, in accordance with an exemplary embodiment.

DETAILED DESCRIPTION

Figure 5:
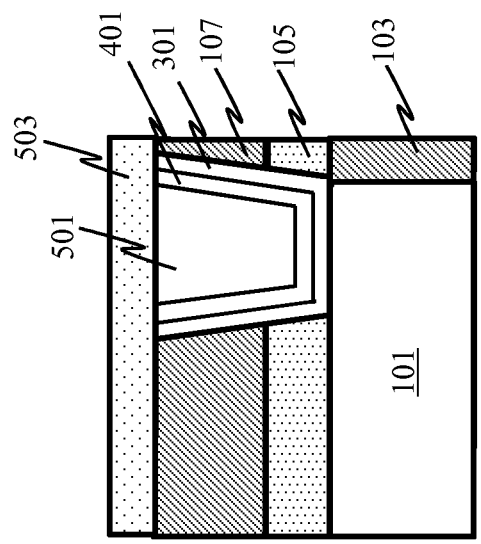

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced moisture and/or oxygen barrier properties attendant upon forming thinner barrier/liner stacks for vias and metal lines. In accordance with embodiments of the present disclosure, a moisture scavenging layer is formed prior to depositing the barrier/liner stack, which allows the barrier/liner stack thickness to be reduced.

Methodology in accordance with embodiments of the present disclosure includes forming trenches inside ILK, forming vias through an ILD and capping layer, down to a first metal layer. A moisture scavenging layer precursor is then formed over the ILD and on side and bottom surfaces of the via and is annealed, forming a moisture scavenging layer. Next, a barrier/liner stack is formed over the moisture scavenging layer, and a second metal layer is deposited over the barrier/liner stack and filling the via and trench.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 5 schematically illustrate sequential steps of a process flow, in accordance with an exemplary embodiment. Adverting to FIG. 1, a metal layer 101, for example a metal 1 (M1) layer, is formed in an ILD 103 and capped with a capping layer 105. The metal layer 101 may be formed of copper or tungsten lines connected to a semiconductor device as part of an integrated circuit. The ILD may be ULK dielectric (a dielectric material having a dielectric constant significantly less than 3.9, i.e. smaller than 3.9), for example 2.55. Another ILD 107, for example a ULK dielectric like ILD 103, is formed over capping layer 105. Vias 109 (a single via is shown for illustrative convenience) and trench 111 for the next metal layer, for example for a metal 2 (M2) layer, are patterned and etched through ILD 107 and capping layer 105 using hardmask 113 to define the trench and via dimensions and locations. Vias 109 and trench 111 may be etched separately or together, for example by a dual damascene process.

As illustrated in FIG. 2, a moisture scavenging layer precursor 201, such as a Mn layer or a Ti layer, is deposited over hardmask 113 and ILD 107 and on side and bottom surfaces of via 109 and trench 111. Moisture scavenging layer precursor layer 201 may be formed to a thickness of 5 to 20 Å. Next, moisture scavenging layer precursor 201 is annealed, for example for 60 to 3600 seconds at 150 to 400° C., forming moisture scavenging layer 301, as illustrated in FIG. 3. Layer 301 may be, for example, a manganese oxide ($MnO_x$) layer or a titanium oxide (TiOx) layer. During the anneal, moisture in ILD 107 (absorbed during various wet processes during patterning) reacts with the Mn or Ti to reduce the overall system chemical potential, and moisture concentration in ILD 107 is reduced.

Adverting to FIG. 4, barrier/liner stack 401 is deposited on moisture scavenging layer 301 (over ILD 107 and on side and bottom surfaces of via 109 and trench 111). Barrier/liner stack 401 may be formed of a layer of PVD or ALD deposited TaN followed by a layer of Ta, Co, or Ru and may be formed to a thickness of 10 to 80 Å, for example 20 Å. As moisture concentration is reduced in ILD 107, the thickness of barrier/liner stack 401 may be reduced from current thicknesses, since less moisture will be outgassed into the metal lines and vias during EM stress or product application. Next, a metal 403, e.g. Cu, is deposited over ILD 107 and filling vias 109 and trench 111.

CMP is performed, planarizing metal 403 (forming metal layer 501), barrier/liner stack 401, moisture scavenging layer 301, and hard mask 113 down to and into ILD 107, as illustrated in FIG. 5. The depth into ILD 107 to which the layers are planarized is selected according to a target trench 111 depth. A capping layer 503, which may be the same as capping layer 105, is deposited over metal layer 501. The process illustrated in and described with respect to FIGS. 1 through 5 may be repeated for subsequent metal layers, and other conventional BEOL processing may proceed.

The embodiments of the present disclosure can achieve several technical effects, such as thinner barrier/liner stacks without compromising moisture and oxygen barrier properties, thereby reducing via and line resistance. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices, particularly for the 32 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a via through an interlayer dielectric (ILD) and capping layer, down to a first metal layer;
   forming a moisture scavenging layer precursor over the ILD and on side and bottom surfaces of the via and trench;
   annealing the moisture scavenging layer precursor, forming a moisture scavenging layer;
   forming a barrier/liner stack over the moisture scavenging layer; and
   depositing a second metal layer over the barrier/liner stack and filling the via and trench.

2. The method according to claim 1, wherein the ILD comprises an ultra-low-k (ULK) dielectric layer.

3. The method according to claim 1, comprising forming the moisture scavenging layer precursor of manganese or titanium.

4. The method according to claim 1, comprising forming the moisture scavenging layer to a thickness of 5 to 20 angstroms (Å).

5. The method according to claim 1, comprising forming the barrier/liner stack to a thickness of 10 to 80 Å on the side and bottom surfaces of the via.

6. The method according to claim 5, comprising: forming the barrier/liner stack of tantalum nitride (TaN) and tantalum (Ta).

7. The method according to claim 5, comprising: forming the barrier/liner stack of TaN and cobalt (Co) or ruthenium (Ru).

8. The method according to claim 1, comprising depositing the second metal layer of copper (Cu).

9. The method according to claim 1, further comprising performing chemical mechanical polishing (CMP) subsequent to depositing the second metal layer.

10. The method according to claim 9, further comprising forming a second capping layer over the second metal layer subsequent to performing CMP.

11. A device comprising:
a first metal layer;
a capping layer over the first metal layer;
an interlayer dielectric (ILD) over the capping layer;
a trench and a via formed through the ILD and the capping layer, down to the first metal layer;
a moisture scavenging layer over the ILD and on side and bottom surfaces of the trench and the via;
a barrier/liner stack over the moisture scavenging layer; and
a second metal layer over the barrier/liner stack and filling the via and trench.

12. The device according to claim 11, wherein the ILD comprises an ultra-low-k (ULK) dielectric layer.

13. The device according to claim 11, wherein the moisture scavenging layer comprises manganese oxide ($MnO_x$) or titanium oxide ($TiO_x$).

14. The device according to claim 11, wherein the moisture scavenging layer has a thickness of 5 to 20 angstroms (Å).

15. The device according to claim 11, wherein the barrier/liner stack has a thickness of 10 to 80 Å on the side and bottom surfaces of the via.

16. The device according to claim 15, wherein the barrier/liner stack comprises tantalum nitride (TaN) and tantalum (Ta).

17. The device according to claim 15, wherein the barrier/liner stack comprises TaN and cobalt (Co) or ruthenium (Ru).

18. The device according to claim 11, wherein the second metal layer comprises copper.

19. The device according to claim 11, further comprising a second capping layer over the second metal layer.

20. A method comprising:
forming a via through an ultra-low-k (ULK) interlayer dielectric (ILD) and capping layer, down to a first metal layer;
forming a manganese (Mn) layer to a thickness of 5 to 20 angstroms (Å) over the ILD and on side and bottom surfaces of the via;
annealing the Mn layer, forming a $MnO_x$ layer;
forming a barrier/liner stack of tantalum nitride (TaN) and tantalum (Ta), cobalt (Co), or ruthenium (Ru) to a thickness of 10 to 80 Å on the side and bottom surfaces of the via over the $MnO_x$ layer;
depositing a copper (Cu) layer over the barrier/liner stack and filling the via and trench;
performing chemical mechanical polishing (CMP); and
forming a second capping layer over the copper layer.

* * * * *